(12) United States Patent
Masenas

(10) Patent No.: US 6,185,057 B1
(45) Date of Patent: Feb. 6, 2001

(54) METHOD AND APPARATUS FOR INCREASING THE SPEED OF WRITE DRIVER CIRCUITRY

(75) Inventor: Charles J. Masenas, Essex Junction, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/176,227

(22) Filed: Oct. 21, 1998

(51) Int. Cl.$^7$ .................................................. G11B 5/09
(52) U.S. Cl. ............................ 360/46; 360/68; 360/61; 327/110; 327/345
(58) Field of Search ................... 360/68, 67, 46, 360/61; 327/110, 344, 345, 362, 363

(56) References Cited

U.S. PATENT DOCUMENTS

| | | |
|---|---|---|
| 4,647,988 | 3/1987 | Takehara . |
| 5,057,720 | 10/1991 | Hattori . |
| 5,282,094 | 1/1994 | Ngo . |
| 5,331,479 | 7/1994 | Madsen . |
| 5,333,081 * | 7/1994 | Mitsui ................................. 360/68 X |
| 5,386,328 * | 1/1995 | Chiou et al. .......................... 360/68 |
| 5,530,639 | 6/1996 | Schulz et al. . |
| 5,612,828 * | 3/1997 | Brannon et al. ...................... 360/46 |
| 5,781,046 * | 7/1998 | Ngo et al. .......................... 360/68 X |

* cited by examiner

Primary Examiner—Alan T. Faber
(74) Attorney, Agent, or Firm—Schmeiser, Olsen & Watts; Eugene I. Shkurko

(57) ABSTRACT

An H-driver circuit is provided that has a mechanism for selectively reducing one or more RC time constants within the H-driver circuit. Selectively reducing one or more RC time constants within the H-driver circuit reduces the turn-ON time of one or more of the H-driver circuit's pull-up transistors, and increases the speed of the H-driver circuit with little increase in power consumption. Each RC time constant preferably is selectively reduced via a feedback path between an output terminal of the H-driver circuit and a resistance reducer operatively coupled to the pull-up transistor whose turn-ON time is to be reduced. Preferably the resistance reducer comprises a transistor, more preferably a MOSFET and most preferably a p-channel MOSFET.

23 Claims, 5 Drawing Sheets

METHOD AND APPARATUS FOR INCREASING THE SPEED OF WRITE DRIVER CIRCUITRY

FIELD OF THE INVENTION

The present invention generally relates to magnetic storage media and more specifically relates to an improved write driver circuit for writing information to a magnetic storage media.

BACKGROUND OF THE INVENTION

Magnetic storage devices such as computer hard drives write binary information to and read binary information from a magnetic storage media (e.g., a magnetic disc comprising $Fe_2O_3$, NiCo, etc.). Binary information is written to the magnetic storage media by changing the magnetization of domains within the media to either a first magnetization (e.g., representing a binary "1") or a second magnetization (e.g., representing a binary "0"). Written binary information is read from the magnetic storage media by rotating the magnetized media at a constant velocity and by sensing the time-changing flux produced by each magnetized domain.

Within each magnetic storage device, in addition to the magnetic storage media, a write head is provided that comprises an inductive coil for generating a two-directional or "bipolar" flux which changes the magnetization of the domains within the magnetic storage media between the first and second magnetizations. The bipolar flux is generated via a bipolar current driven through the inductive coil by a write driver circuit.

Typically, the speed of the write driver circuit that drives the inductive write head governs the maximum operating speed (e.g., the maximum read/write time) of a magnetic storage device; and the speed of a write driver circuit is the time required to switch the direction of the current flowing through the inductive coil of the write head as described below with reference to FIGS. 1A and 1B.

Magnetic storage devices typically employ a write driver circuit known as an H-driver circuit, such as the H-driver circuit 100 (hereinafter "conventional H-driver 100") of FIG. 1A. The conventional H-driver 100 drives a differential current through a write coil (e.g., write coil 102) coupled between a first differential output terminal $OUT_T$ (e.g., "Output True") and a second differential output terminal $OUT_C$ (e.g., "Output Complement") of the H-driver 100 to affect magnetization of a magnetic storage media (not shown) adjacent the write coil 102. Specifically, a differential input voltage applied between a first differential input terminal $IN_T$ (e.g., "Input True") and a second differential input terminal $IN_C$ (e.g., "Input Complement") of the H-driver 100 controls the direction of differential current flow through the write coil 102, and thus the magnetization written to the magnetic storage media (not shown).

A typical differential input voltage might be 500 millivolts centered at −2 volts, so that a "high" input voltage level on either input terminal $IN_T$ or $IN_C$ is −1.75 volts and a "low" input voltage level on either input terminal $IN_T$ or $IN_C$ is −2.25 volts. Other differential input voltages and center voltages may be employed.

The H-driver 100 further comprises a first pull-down transistor ($Q_1$) 104 for pulling the output terminal $OUT_C$ to a low voltage level with respect to the output terminal $OUT_T$ (e.g., by sourcing current through the write coil 102 in a first direction as described below) and a second pull-down transistor ($Q_2$) 106 for pulling the output terminal $OUT_T$ to a low voltage level with respect to the output terminal $OUT_C$ (e.g., by sourcing current through the write coil 102 in a second direction as describe below). The first pull-down transistor 104 has a base lead connected to the input terminal $IN_T$, a collector lead connected to the output terminal $OUT_C$ and an emitter lead connected to a negative voltage rail ($V_{ee}$) 108 via a first current source ($J_1$) 110. The second pull-down transistor 106 has a base lead connected to the input terminal $IN_C$, a collector lead connected to the output terminal $OUT_T$ and an emitter lead connected to the emitter lead of the first pull-down transistor 104 and to the first current source 110.

Also provided within the H-driver 100 are a first pull-up transistor ($Q_5$) 112 for pulling the output terminal $OUT_C$ to a high voltage level with respect to the output terminal $OUT_T$ and a second pull-up transistor ($Q_6$) 114 for pulling the output terminal $OUT_T$ to a high voltage level with respect to the output terminal $OUT_C$. The first pull-up transistor 112 has a base lead connected to a positive voltage rail ($V_{CC}$) 116 via a first pull-up resistor ($R_1$) 118, a collector lead connected to the positive voltage rail 116 and an emitter lead connected to the output terminal $OUT_C$ via a first Schottky diode ($D_1$) 120. The high D.C. voltage level for the output terminal $OUT_C$, therefore, is approximately $V_{CC}$ minus the forward voltage of the first pull-up transistor 112's base-emitter junction and the forward voltage of the first Schottky diode 120 (neglecting the IR drop associated with the first pull-up resistor 118). The second pull-up transistor 114 has a base lead connected to the positive voltage rail 116 via a second pull-up resistor ($R_2$) 122, a collector lead connected to the positive voltage rail 116 and an emitter lead connected to the output terminal $OUT_T$ via a second Schottky diode ($D_2$) 124. The high D.C. voltage level for the output terminal $OUT_T$, therefore, is approximately $V_{CC}$ minus the forward voltage of the second pull-up transistor 114's base-emitter junction and the forward voltage of the second Schottky diode 124 (neglecting the IR drop from the second pull-up resistor 122). The first and the second Schottky diodes 120 and 124 protect the base-emitter junctions of the first and the second pull-up transistors 112 and 114, respectively, from being reverse biased and damaged during switching of the current flow direction through the write coil 102 (as described below).

The H-driver 100 further comprises a third pull-down transistor ($Q_3$) 126 and a fourth pull-down transistor ($Q_4$) 128 for pulling to a low voltage level the base lead of the first pull-up transistor 112 and the base lead of the second pull-up transistor 114, respectively. The third pull-down transistor 126 has a base lead connected to the input terminal $IN_T$, a collector lead connected to the base lead of the first pull-up transistor 112 and an emitter lead connected to the negative voltage rail 108 via a second current source ($J_2$) 130. A third Schottky diode ($D_3$) 132 is connected between the collector of the third pull-down transistor 126 (forming a first node 134) and ground for preventing the first node 134 from being pulled below ground by more than the forward voltage (e.g., about 0.4–0.5 volts) of the third Schottky diode 132.

The fourth pull-down transistor 128 has a base lead connected to the input terminal $IN_C$, a collector lead connected to the base lead of the second pull-up transistor 114 and an emitter lead connected to the emitter lead of the third pull-down transistor 126 and to the second current source 130. A fourth Schottky diode ($D_4$) 136 is connected between the collector of the fourth pull-down transistor 128 (forming a second node 138) and ground for preventing the second node 138 from being pulled below ground by more than the forward voltage (e.g., about 0.4–0.5 volts) of the fourth Schottky diode 136.

In operation, if a high voltage level is applied to the input terminal $IN_T$ and a low voltage level is applied to the input terminal $IN_C$, the high voltage level applied to the input terminal $IN_T$ turns ON the first and the third pull-down transistors 104 and 126 by forward biasing each transistor's base-emitter junction. Currents $J_1$ and $J_2$ (from the first and second current sources 110 and 130, respectively) thereby are caused to flow through the first and the third pull-down transistors 104 and 126, respectively.

In steady-state, with the third pull-down transistor 126 ON, the first node 134 is pulled to a low voltage level (i.e., is pulled low), the Schottky diode 132 is forward biased and conducts, and the current $J_2$ flowing through the third pull-down transistor 126 is split between the first pull-up resistor 118 and the third Schottky diode 132. Because the third Schottky diode 132 conducts, the voltage at the first node 134 is held slightly negative (e.g., at approximately the forward voltage of the third Schottky diode 132 below ground). With the first node 134 pulled low via the third pulled-down transistor 126, the base of the first pull-up transistor 112 also is pulled low, and the first pull-up transistor 112 is OFF.

The low voltage level applied to the input terminal $IN_C$ turns OFF the second and the fourth pull-down transistors 106 and 128. With the fourth pull-down transistor 128 OFF, only a small voltage drop (e.g., due to the base current from the second pull-up transistor 114) can exist across the second pull-up resistor 122. Therefore, the second node 138 is pulled to a high voltage level (i.e., is pulled high), the base-emitter junction of the second pull-up transistor 114 is forward biased (turning ON the second pull-up transistor 114), and the second Schottky diode 124 is forward biased. Accordingly, the current $J_1$ from the first current source 110 flows from the positive voltage rail 116 through the second pull-up transistor 114, through the second Schottky diode 124, through the write coil 102 (in a first direction designated as the −y direction in FIG. 1A), through the first pull-down transistor 104 and through first current source 110 to the negative voltage rail 108. The flow of the current $J_1$ through the write coil 102 in the first direction generates a magnetic flux that changes the magnetization of a domain within a magnetic storage media (not shown) adjacent the write coil 102 to a first magnetization (e.g., the first magnetization representing a binary "1") as the magnetic storage media is rotated.

Thereafter, to write a second magnetization to the magnetic storage media (not shown), the direction of the current flow through the write coil 102 is reversed (e.g., so the current $J_1$ flows in the opposite or +y direction through the write coil 102) by applying a low voltage level to input terminal $IN_T$ and a high voltage level to the input terminal $IN_C$. FIG. 1B is a schematic diagram of the H-driver 100 of FIG. 1A showing the current flow within the H-driver 100 when a low voltage level is applied to the input terminal $IN_T$ and a high voltage level is applied to the input terminal $IN_C$.

With reference to FIG. 1B, in steady-state, with the input terminal $IN_C$ at a high voltage level and the input terminal $IN_T$ at a low voltage level, the H-driver 100 behaves as the inverted equivalent of the oppositely biased H-driver 100 of FIG. 1A. Specifically, the second and the fourth pull-up transistors 106 and 128 are ON so as to pull the output terminal $OUT_T$ and the base of the second pull-up transistor 114 low (turning OFF the second pull-up transistor 114), and the first and the third pull-down transistors 104 and 126 are OFF such that currents $J_1$ and $J_2$ flow through the second and the fourth pull-down transistors 106 and 128, respectively.

With the fourth pull-down transistor 128 ON, the second node 138 is pulled low, the Schottky diode 136 is forward biased and conducts, and the current $J_2$ flowing through the fourth pull-up transistor 128 is split between the second pull-up resistor 122 and the fourth Schottky diode 136. Because the fourth Schottky diode 136 conducts, the voltage of the second node 138 is held slightly negative (e.g., at approximately the forward voltage of the fourth Schottky diode 136 below ground).

In steady-state, with the first and the third pull-up transistors 104 and 126 OFF, little current flows through the first pull-up resistor 118 so that the first node 134 is pulled high, the base-emitter junction of the first pull-up transistor 112 is forward biased (turning ON the first pull-up transistor 112), and the first Schottky diode 120 is forward biased. Accordingly, the current $J_1$ flows from the positive voltage rail 116 through the first pull-up transistor 112, through the first Schottky diode 120, through the write coil 102 in the second direction (the +y direction) opposite the first direction, through the second pull-down transistor 106 and through the first current source 110 to the negative voltage rail 108. The flow of the current $J_1$ through the write coil 102 in the second direction generates a magnetic flux that changes the magnetization of a domain within a magnetic storage media (not shown) adjacent the write coil 102 to a second magnetization (e.g., the second magnetization representing a binary "0") as the magnetic storage media is rotated.

As previously stated, the speed of a write driver circuit such as the H-driver 100 typically governs the maximum speed of a magnetic storage device employing the write driver circuit. The speed of the H-driver 100 is the time required to switch the direction of the current flowing through the write coil 102 between the first direction (FIG. 1A) and the second direction (FIG. 1B); and how quickly the current direction can change primarily depends on the voltage applied across the write coil 102 during current direction switching. Specifically, the time rate of change of the current flowing through the write coil 102 is governed by the equation:

$$\frac{dJ}{dt} = \frac{1}{L} V_{WC} \quad (1)$$

where J is the current flowing through the write coil 102, L is the inductance of the write coil 102 and $V_{WC}$ is the voltage applied across the write coil 102 by the H-driver 100 during current direction switching (i.e., the coil voltage $V_{WC}$). As shown by equation (1), maximizing the coil voltage $V_{WC}$ maximizes the speed of current direction switching.

Up to a limit, the coil voltage $V_{WC}$ (and thus the current direction switching speed of the H-driver 100) can be increased by decreasing the resistance values of the first and the second pull-up resistors 118 and 122, and by increasing the current $J_2$ supplied by the second current source 130. Decreasing the resistance values of the first and the second pull-up resistors 118 and 122 decreases the RC time constants of the current paths responsible for pulling high the first and the second nodes 134 and 138 (current path A and current path B, respectively, in FIGS. 1A and 1B), and thus allows each node to be pulled high faster. As will be further understood with reference to the detailed description of the preferred embodiments, quickly pulling high the first and the second nodes 134 and 138 can increase the coil voltage $V_{WC}$ during current direction switching (and thus the current direction switching speed of the H-driver 100) if the minimum node voltage level which the first and the second nodes 134 and 138 were pulled to prior to decreasing the resistance values of the first and the second pull-up resistors 118 and 122 (i.e., the minimum node voltage of the H-driver 100) is maintained. Increasing the current $J_2$ compensates for the decreased resistance values of the first and the second pull-up resistors 118 and 122 (e.g., by keeping the IR drop across each pull-up resistor constant despite the decrease in the resistance value of the pull-up resistor), and maintains constant the minimum node voltage of the H-driver 100. With the first and the second nodes 134 and 138 being pulled high quickly and the minimum node voltage of the H-driver 100 maintained, the coil voltage $V_{WC}$ is increased, as is the current direction switching speed of the H-driver 100.

Increasing the current $J_2$ increases the power consumption of the H-driver 100, which is especially problematic in low power applications (e.g., portable computing). Additionally, the higher currents within the H-driver 100 require the use of larger current switches (e.g., larger third and fourth pull-down transistors 126 and 128). The larger current switches have slower switching speeds that can effectively reduce the current direction switching speed of the H-driver 100.

Accordingly, a need exists for a method and apparatus for increasing the speed of magnetic storage device write driver circuitry. Such a method and apparatus will increase the overall operating speed of magnetic storage devices.

SUMMARY OF THE INVENTION

To address the needs of prior art write driver circuitry, an inventive H-driver circuit is provided that has a mechanism for reducing one or more RC time constants within the H-driver circuit only during certain stages of the H-driver circuit's operation (i.e., selectively reducing one or more RC time constants). Selectively reducing one or more RC time constants within the H-driver circuit reduces the turn-ON time of one or more of the H-driver circuit's pull-up transistors while maintaining the minimum node voltage of the H-driver circuit with little increase in the H-driver circuit's power consumption. Specifically, the RC time constant of a current path responsible for pulling the base lead of a pull-up transistor to a high voltage level is selectively reduced to allow the base lead to be rapidly pulled to a high voltage level sufficient to turn ON the transistor. The pull-up transistor thereby turns ON rapidly, the voltage applied to the write coil is increased and the current direction within write coil is quickly switched.

To selectively reduce an RC time constant, a positive feedback path preferably is provided between an H-driver circuit's differential output terminal and a mechanism for reducing resistance (i.e., a resistance reducer) operatively coupled to the pull-up transistor. As used herein, the term "operatively coupled" means coupled so as to operate, and may comprise direct or indirect coupling.

When the differential output terminal coupled to the resistance reducer experiences a voltage change during a switching stage of the H-driver circuit's operation, the resistance reducer reduces the resistance between the base lead of the pull-up transistor and a high voltage rail such as a positive voltage rail or $V_{CC}$ (i.e., reduces the pull-up resistance associated with the pull-up transistor or the pull-up transistor's "pull-up resistance") operatively coupled to the resistance reducer. The RC time constant of the current path responsible for pulling the base lead of the pull-up transistor to a high voltage level thereby is reduced, and the pull-up transistor may be turned ON rapidly. Preferably the resistance reducer only reduces the pull-up transistor's pull-up resistance when the pull-up transistor is ON or is turning ON. Accordingly, the reduced pull-up resistance does not affect the minimum node voltage of the H-driver circuit. The resistance reducer preferably comprises a transistor, more preferably a metal-oxide-semiconductor-field-effect-transistor (MOSFET), and most preferably a p-channel MOSFET.

By selectively reducing one or more RC time constants within the H-driver circuit, the time required for the H-driver circuit's pull-up transistors to turn ON is decreased, the voltage applied to the write coil during current direction switching is increased and the time required to switch the direction of current flow through the write coil is decreased. Therefore, the present invention reduces the write time of a magnetic storage device employing the inventive H-driver circuit; and write time is reduced with little increase in power consumption.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1A:
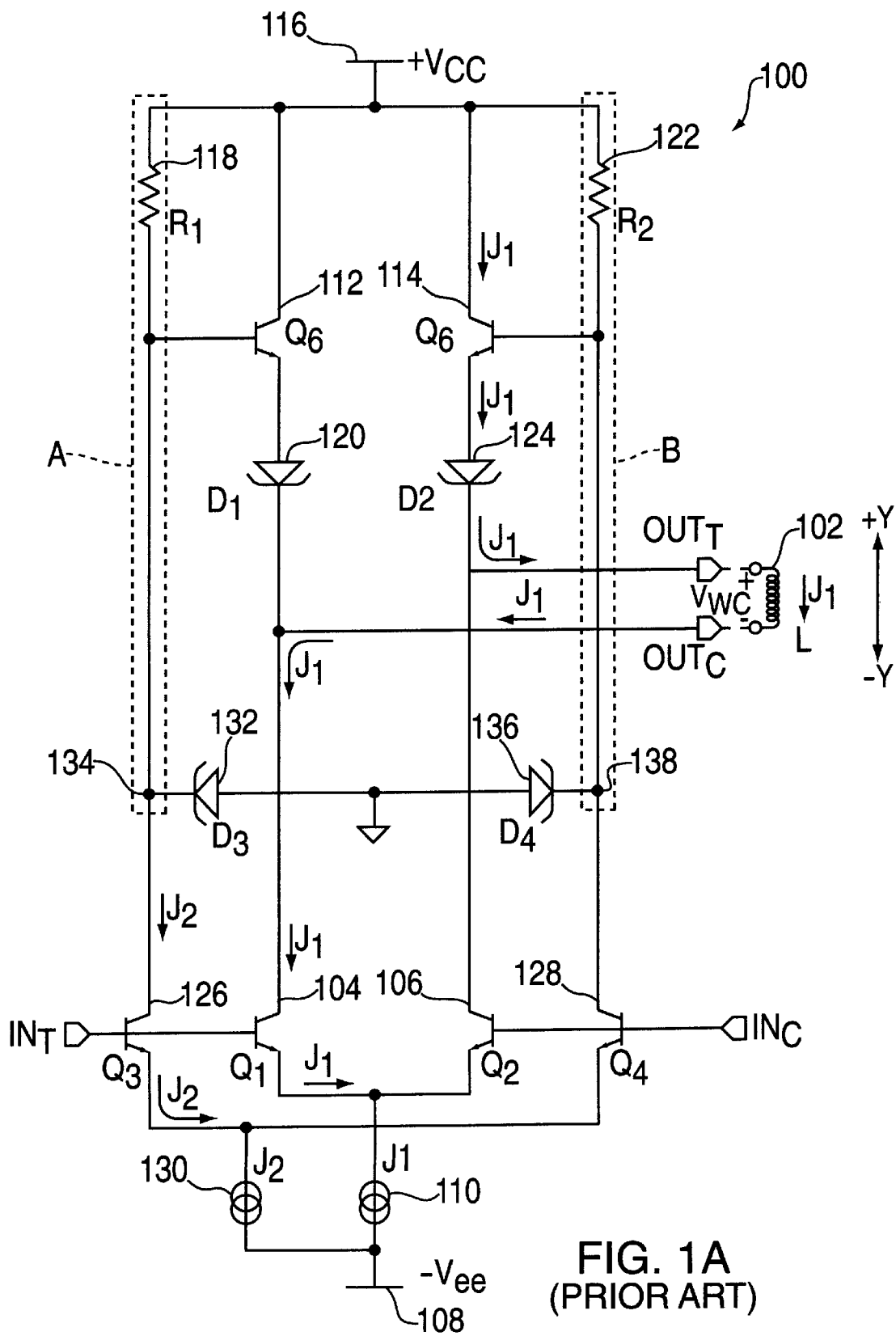
FIGS. 1A and 1B are schematic diagrams of a conventional H-driver circuit for writing binary information to a magnetic storage media via a first and a second magnetization, respectively, as previously described.
Figure 1B:
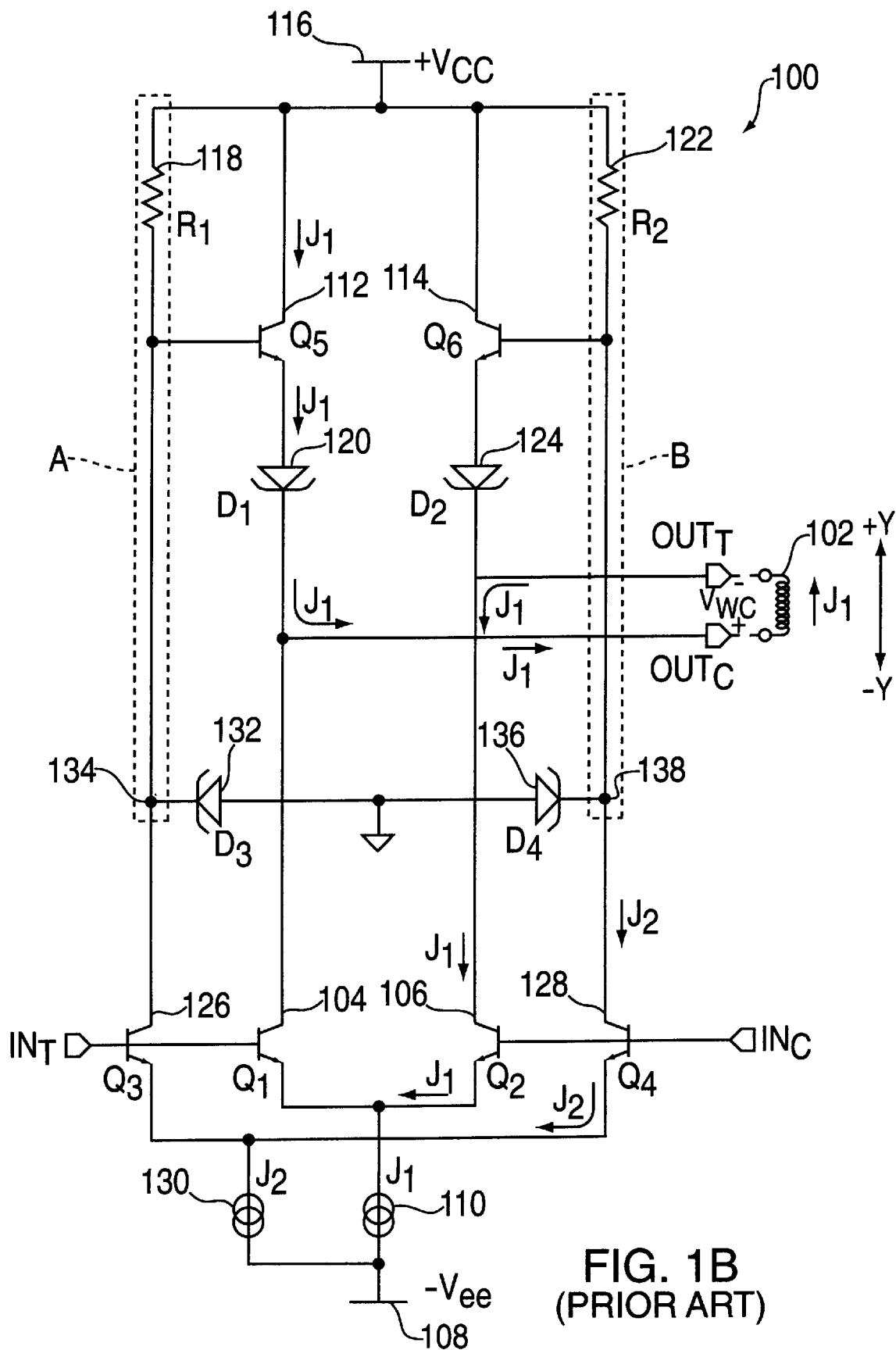
Figure 2A:
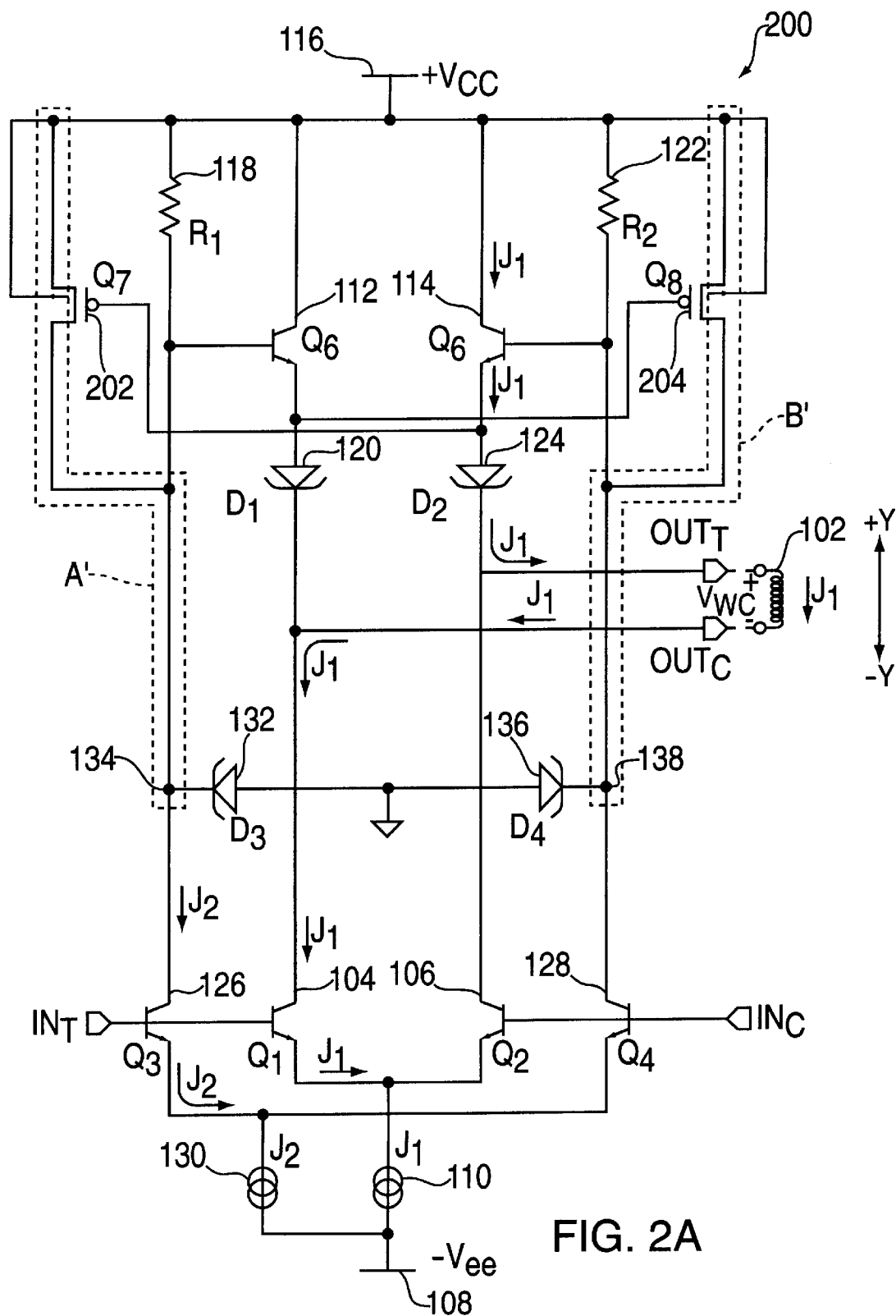
FIGS. 2A and 2B are schematic diagrams of an inventive H-driver circuit for writing binary information to a magnetic storage media via a first and a second magnetization, respectively.

FIG. 2A is a schematic diagram of an inventive H-driver circuit 200 (hereinafter "H-driver 200") for writing binary information to a magnetic storage media (not shown). In addition to the electrical components, electrical connections and voltage rails designated by reference numbers 104–138 and previously described with reference to FIGS. 1A and 1B, the H-driver 200 comprises a first resistance reducer (first p-channel MOSFET ($Q_7$) 202, hereinafter "first P-FET 202") and a second resistance reducer (second p-channel MOSFET ($Q_8$) 204, hereinafter "second P-FET 204").

The first P-FET 202 is operatively coupled in parallel with the first pull-up resistor 118 and has a source lead and a body lead operatively coupled to the positive voltage rail 116, a drain lead operatively coupled to the base lead of the first pull-up transistor 112 and a gate lead operatively coupled to the output terminal $OUT_T$ via the second Schottky diode 124. Similarly, the second P-FET 204 is operatively coupled in parallel with the second pull-up resistor 122 and has a source lead and a body lead operatively coupled to the positive voltage rail 116, a drain lead operatively coupled to the base lead of the second pull-up transistor 114 and a gate lead operatively coupled to the output terminal $OUT_C$ via the first Schottky diode 120.

The steady-state operation of the inventive H-driver 200 is essentially identical to the steady-state operation of the conventional H-driver 100 of FIGS. 1A and 1B and therefore is not described in detail herein. Most importantly, with a high voltage level applied to the input terminal $IN_T$ and a low voltage level applied to the input terminal $IN_C$, the current $J_1$ flows through the write coil 102 in the first direction (FIG. 2A) so as to generate a magnetic flux that changes the magnetization of a domain within a magnetic storage media (not shown) adjacent the write coil 102 to a first magnetization (e.g., representing a binary "1"). With a low voltage level applied to the input terminal $IN_T$ and a high voltage level applied to the input terminal $IN_C$, the current $J_1$ flows through the write coil 102 in the second direction (FIG. 2B) so as to generate a magnetic flux that changes the magnetization of a domain within a magnetic storage media (not shown) adjacent the write coil 102 to a second magnetization (e.g., representing a binary "0").

The main benefits of the inventive H-driver 200 occur during the switching stages of the H-driver 200's operation (e.g., the times during which the current direction through the write coil 102 is switched between the first and the second directions). During switching (as described further below), one or more RC time constants within the H-driver 200 are reduced to affect rapid switching of the current direction between the first (FIG. 2A) and the second (FIG. 2B) directions with little increase in the H-driver 200's power consumption. Specifically, the RC time constant of the current path responsible for pulling the first node 134 to a voltage level sufficient to turn ON the first pull-up transistor 112 (i.e., the first pull-up transistor 112's turn-on voltage) and the RC time constant of the current path responsible for pulling the second node 138 to a voltage level sufficient to turn ON the second pull-up transistor 114 (i.e., the second pull-up transistor 114's turn-ON voltage) are selectively reduced by selectively reducing the pull-up resistances associated with the first and the second pull-up transistors 112 and 114, respectively.

Figure 2B:
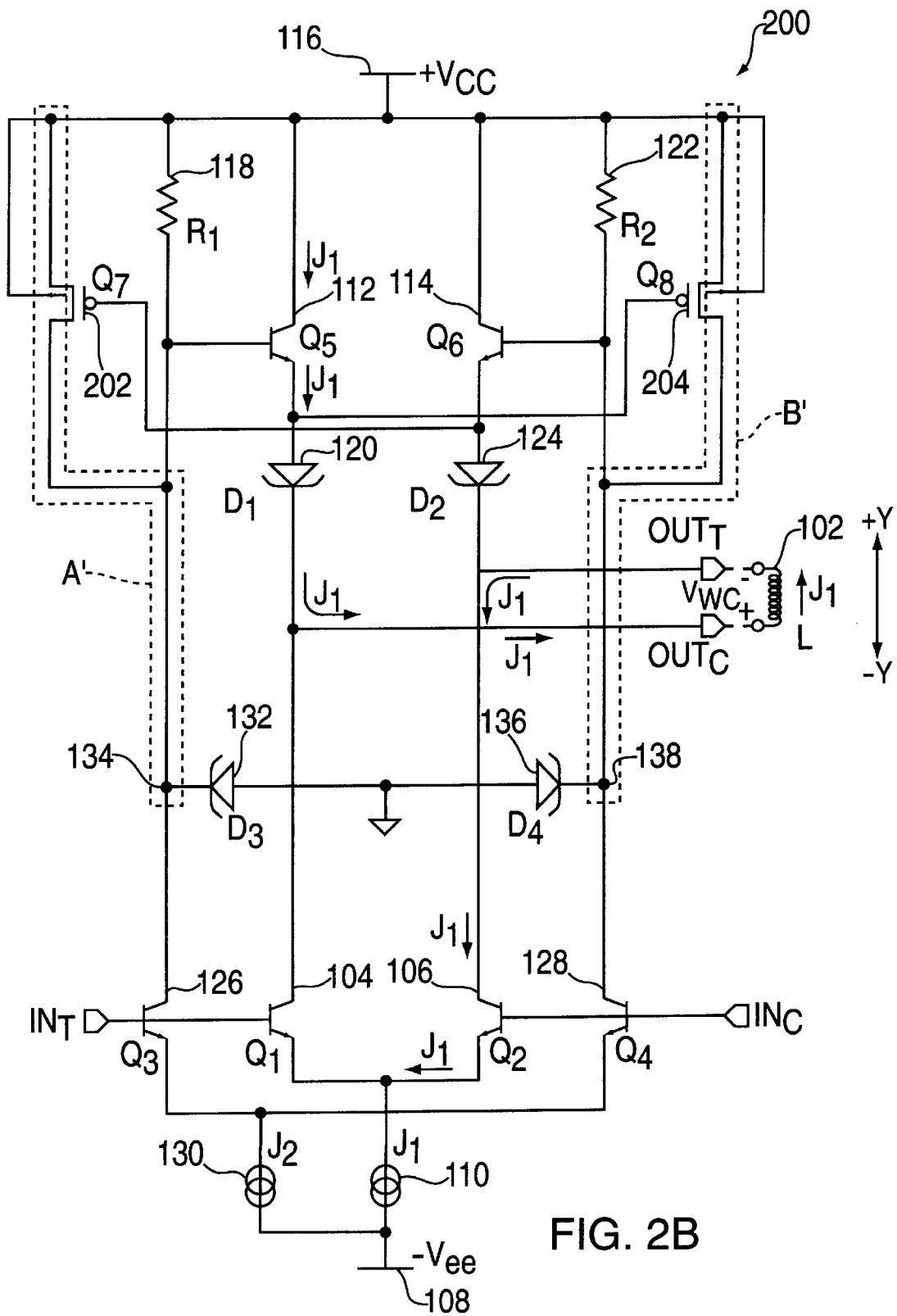

Absent the first P-FET 202, the current path responsible for pulling the first node 134 to the first pull-up transistor 112's turn-ON voltage is the same as the current path A of FIGS. 1A and 1B, and the current path's RC time constant comprises the resistance of the first pull-up resistor 118 and the parasitic capacitances of the first pull-up resistor 118, the third Schottky diode 132 and the base-collector junctions of the third pull-down and the first pull-up transistors 126 and 112, respectively. However, with the first P-FET 202 present and ON (as described below), the current path responsible for pulling the first node 134 to the first pull-up transistor 112's turn-ON voltage comprises a current path A' as shown in FIGS. 2A and 2B, and the current path's RC time constant is reduced (by reducing the resistive component of the RC time constant, specifically the pull-up resistance associated with the first pull-up transistor 112) and comprises the resistance of the first P-FET 202's conducting channel and the parasitic capacitances of the first P-FET 202, the third Schottky diode 132, and the base-collector junctions of the third pull-down and the first pull-up transistors 126 and 112, respectively.

Similarly, absent the second P-FET 204, the current path responsible for pulling the second node 138 to the second pull-up transistor 114's turn-ON voltage is the same as the current path B of FIGS. 1A and 1B, and the current path's RC time constant comprises the resistance of the second pull-up resistor 122 and the parasitic capacitances of the second pull-up resistor 122, the fourth Schottky diode 136 and the base-collector junctions of the fourth pull-down and the second pull-up transistors 128 and 114, respectively. However, with the second P-FET 204 present and ON (as described below), the current path responsible for pulling the second node 138 to the second pull-up transistor 114's turn-ON voltage comprises a current path B' as shown in FIGS. 2A and 2B, and the current path's RC time constant is reduced (by reducing the resistive component of the RC time constant, specifically the pull-up resistance associated with the second pull-up transistor 114) and comprises the resistance of the second P-FET 204's conducting channel and the parasitic capacitances of the second P-FET 204, the fourth Schottky diode 136 and the base-collector junctions of the fourth pull-down and the second pull-up transistors 128 and 114, respectively.

Reducing the RC time constants of the current paths responsible for pulling high the first and the second nodes 134 and 138 substantially reduces the turn-ON time of the first and the second pull-up transistors 112 and 114, respectively, by rapidly pulling the base of each transistor to a voltage level required to forward bias the transistor's base-emitter junction. However, as previously described, reducing the pull-up resistances associated with the first and the second pull-up transistors 112 and 114 by merely decreasing the resistor values of the first and second pull-up resistors 118 and 122, respectively, requires a substantial increase in power consumption by an H-driver circuit as the current $J_2$ from the second current source 130 must be increased to maintain the minimum node voltage of the H-driver circuit (so as to increase the voltage applied across the write coil 102 to affect a rapid change in the direction of current flow through the write coil 102).

To overcome the problem with increased minimum node voltage absent an increase in power consumption (via increased current $J_2$), the pull-up resistance associated with the first pull-up transistor 112 is reduced only while the first pull-up transistor 112 is ON or is turning ON. Similarly, the pull-up resistance associated with the second pull-up transistor 114 is reduced only while the second pull-up transistor 114 is ON or is turning ON. Specifically, as described below, the first P-FET 202 turns ON only while the first pull-up transistor 112 is ON or is turning ON. At all other times, the first P-FET 202 is OFF and the first pull-up resistor 118 governs the H-driver 200's operation. Accordingly, the first node 134 can be pulled to a sufficiently low voltage to ensure the largest output voltage $V_{WC}$ is applied across the write coil 102 for rapid current direction switching without an increase in the current $J_2$. The second P-FET 204 similarly is ON only while the second pull-up transistor 114 is ON or is turning ON so that the second node 138 can be pulled to a sufficiently low voltage to ensure the largest output voltage $V_{WC}$ is applied across the write coil 102 for rapid current direction switching without an increase in the current $J_2$.

In operation, assuming the current direction within the write coil 102 is to be switched from the first direction (FIG. 2A) to the second direction (FIG. 2B), initially a high voltage level is applied to the input terminal $IN_T$, a low voltage level is applied to the input terminal $IN_C$, the first node 134 is at a low voltage level, the base of the first pull-up transistor 112 is pulled low, the first pull-up transistor 112 is OFF, a voltage $V_{WC}$ exists across the write coil 102 having the polarity shown in FIG. 2A (e.g., $OUT_T$) $OUT_C$), and the current $J_1$ flows through the write coil 102 in the first direction. Thereafter to change the current direction to the second direction (FIG. 2B), a low voltage level is applied to the input terminal $IN_T$ and a high voltage level is applied to the input terminal $IN_C$.

In response to the low voltage level on the input terminal $IN_T$ and the high voltage level on the input terminal $IN_C$, the first and the third pull-down transistors 104 and 126 turn OFF and the second and the fourth pull-down transistors 106 and 128 turn ON. As the first pull-down transistor 104 turns OFF, a large, opposite polarity (e.g., $OUT_C$) $OUT_T$) back EMF is generated across the write coil 102 to resist any change in current flow through the write coil 102. With the fourth pull-down transistor 128 ON, the second pull-up transistor 114 remains ON and the emitter lead of the second pull-up transistor 114 is pulled sufficiently low to turn ON the first P-FET 202. The current path A' thereby is created. The current path A' has a reduced RC time constant that allows the first node 134 to be rapidly raised to the first pull-up transistor 112's turn-ON voltage, and that allows the first pull-up transistor 112 to be rapidly turned ON. The low voltage level on the gate of the first P-FET 202 is maintained by the low voltage level of the second node 138 so that the first P-FET 202 remains ON. Unlike the conventional H-driver 100 of FIGS. 1A and 1B, due to the reduced RC time constant of the current path A', the first pull-up transistor 112 turns ON rapidly and the output terminal $OUT_C$ can be held at its maximum D.C. voltage level (e.g., about the forward voltage of the base-emitter junction of the first pull-up transistor 112 and the forward voltage of the first Schottky diode 120 below the positive voltage rail 116) before the back EMF decays below the output terminal $OUT_C$'s maximum D.C. voltage level.

In response to the back EMF across the write coil 102, the gate of the second P-FET 204 is pulled high and the second P-FET 204 is turned OFF. The second pull-up resistor 122, therefore, controls the current path between the positive voltage rail 116 and the fourth pull-down transistor 128 and allows the second node 138 to be pulled to its minimum node voltage. Accordingly, the largest possible voltage is applied across the write coil 102 immediately after the back EMF decays below the output terminal $OUT_C$'s maximum D.C. voltage level so as to affect rapid current direction switching from the first direction (FIG. 2A) to the second direction (FIG. 2B). Additionally, because $J_2$ does not have to be increased to ensure the second node 138's minimum node voltage is reached, there is little, if any, increased power consumption by the H-driver 200.

In the conventional H-driver 100 of FIGS. 1A and 1B, due to the delay in turn-ON time of the first pull-up transistor 112 caused by the large RC time constant of the current path A, the back EMF decays below the maximum D.C. voltage level for the output terminal $OUT_C$ before the first pull-up transistor 112 turns ON. A smaller voltage, therefore, is applied across the write coil 102 during current direction switching so that current direction switching speed is reduced.

When the current direction through the write coil 102 is to be switched from the second direction (FIG. 2B) to the first direction (FIG. 2A), the inventive H-driver 200 behaves similarly. Namely, when a high voltage level is applied to the input terminal $IN_T$ and a low voltage level is applied to the input terminal $IN_C$, the first and the third pull-down transistors 104 and 126 turn ON and the second and the fourth pull-down transistors 106 and 128 turn OFF. A back EMF thereby is generated across the write coil 102 which turns OFF the first P-FET 202, the first node 134 is pulled low by the third pull-down transistor 126, the first pull-up transistor 112 remains ON and the second P-FET 204 is turned ON. The current path B' thereby is created and has a reduced RC time constant that allows the second node 138 to be rapidly raised to the second pull-up transistor 114's turn-ON voltage, and that allows the second pull-up transistor 114 to be rapidly turned ON. The second pull-up transistor 114 turns ON before the back EMF decays below the maximum D.C. voltage level for the output terminal $OUT_T$, the first node 134 is pulled to its minimum node voltage (as the first P-FET 202 is OFF) and the largest possible voltage is applied across the write coil 102 immediately after the back EMF decays below the output terminal $OUT_T$'s maximum D.C. voltage level so as to affect rapid current direction switching from the second direction (FIG. 2B) to the first direction (FIG. 2A). Because the first pull-up resistor 118 controls the current path between the positive voltage rail 116 and the third pull-down transistor 126, the first node 134 is pulled to its minimum node voltage without increasing the current $J_2$.

Accordingly, by selectively reducing the RC time constants associated with pulling the first node 134 and the second node 138 to a voltage level sufficient to turn-ON the first and the second pull-up transistors 112 and 114, respectively, the speed of the inventive H-driver 200 is increased significantly with little increase in power consumption.

Figure 3:
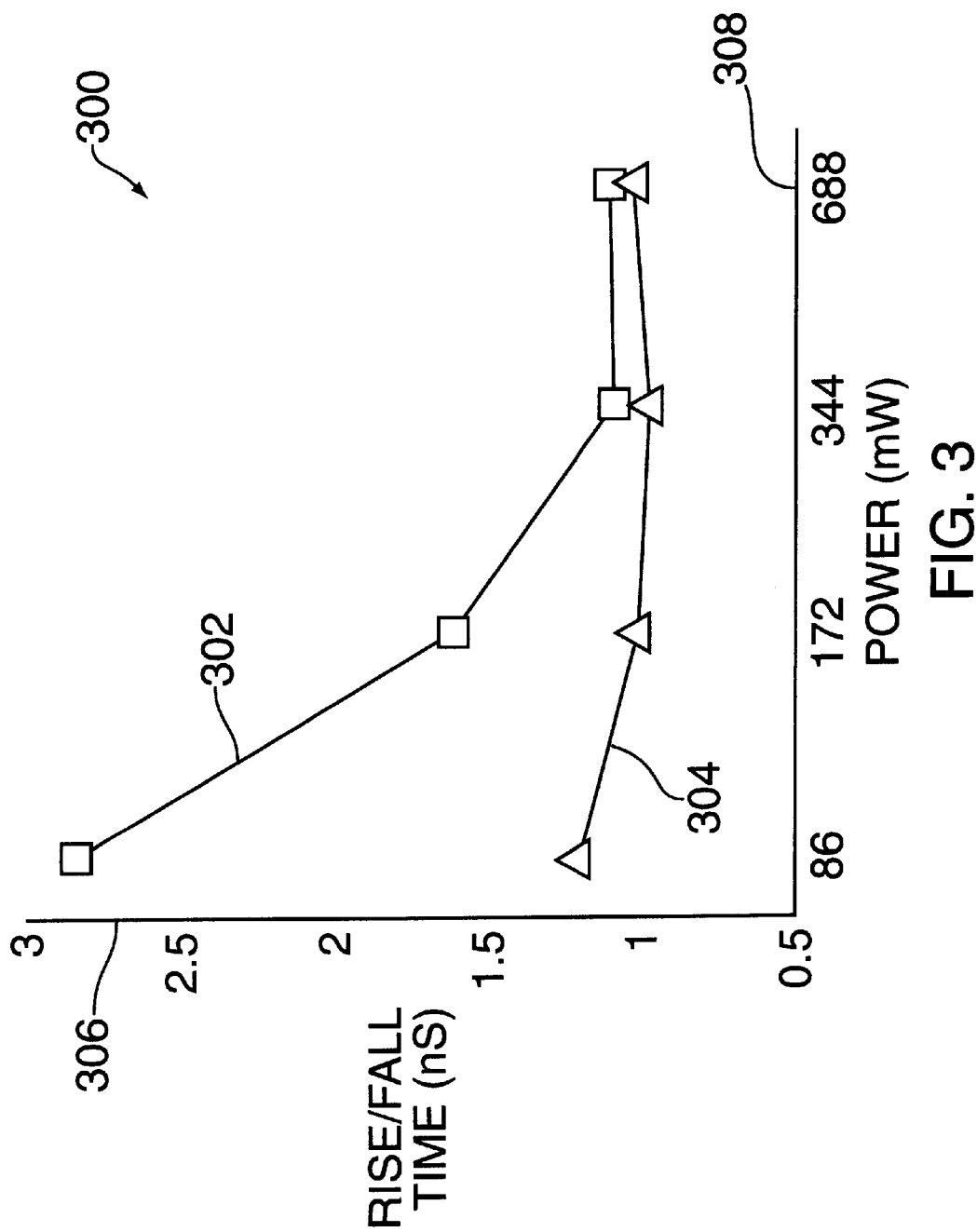
FIG. 3 is a graph of rise/fall time versus power for the conventional H-driver circuit of FIGS. 1A and 1B and for the inventive H-driver circuit of FIGS. 2A and 2B.

FIG. 3 is a graph 300 of rise/fall time versus power for the conventional H-driver 100 of FIGS. 1A and 1B (curve 302) and for the inventive H-driver 200 of FIGS. 2A and 2B (curve 304). Specifically, the y-axis 306 of the graph 300 comprises rise/fall time in nanoseconds and the x-axis 308 comprises the power consumed by each H-driver circuit. As shown in FIG. 3, due to the feedback path from the output terminal $OUT_T$ to the first P-FET 202 that selectively turns ON the first P-FET 202 and allows the RC time constant associated with the first node 134 to be selectively reduced, and due to the feedback path from the output terminal $OUT_C$ to the second P-FET 204 that selectively turns ON the second P-FET 204 and allows the RC time constant associated with the second node 138 to be selectively reduced, the rise/fall time of the inventive H-driver 200 (curve 304) is reduced substantially from the rise/fall time of the conventional H-driver 100 (curve 302) despite no increase in power consumption by the inventive H-driver 200. The performance of the conventional H-driver 100 only approaches the performance of the inventive H-driver 200 at high power levels (e.g., greater than 344 milliwatts).

The foregoing description discloses only the preferred embodiments of the invention, modifications of the above disclosed apparatus and method which fall within the scope of the invention will be readily apparent to those of ordinary skill in the art. For instance, the selective reduction of RC time constants may be employed with other write driver circuit configurations, and other resistance reducers may be employed if desired.

Accordingly, while the present invention has been disclosed in connection with the preferred embodiments thereof, it should be understood that other embodiments may fall within the spirit and scope of the invention, as defined by the following claims.

The invention claimed is:

1. Cross-coupled H-driver apparatus comprising:
    a pair of transistor circuits each coupled to complementary inputs for simultaneously receiving complementary input signals; and
    each of the transistor circuits including feedback devices directly coupled to a voltage terminal and cross-coupled for providing positive feedback to the other of the pair of transistor circuits.

2. An H-driver circuit comprising:
    a first pull-up transistor having a first lead and a second lead;
    a first current path operatively coupled to the first lead of the first pull-up transistor and having a first RC time constant associated therewith; and a first mechanism operatively coupled to the first lead of the first pull-up transistor for selectively reducing the first RC time constant of the first current path.

3. The H-driver circuit of claim 2 further comprising:
a second pull-up transistor having a first lead and a second lead; and
an output terminal operatively coupled to the second lead of the second pull-up transistor;
wherein the first mechanism comprises a first feedback mechanism operatively coupled between the output terminal and the first lead of the first pull-up transistor for selectively reducing the first RC time constant of the first current path.

4. The H-driver circuit of claim 3 further comprising:
a first voltage rail; and
a first pull-up resistor operatively coupled between the first voltage rail and the first lead of the first pull-up transistor such that the first pull-up transistor is characterized by a first pull-up resistance;
wherein the first feedback mechanism comprises a resistance reducer for selectively reducing the first pull-up resistance of the first pull-up transistor so as to selectively reduce the first RC time constant of the first current path.

5. The H-driver circuit of claim 4 wherein the resistance reducer comprises a transistor.

6. The H-driver circuit of claim 5 wherein the transistor comprises a MOSFET.

7. The H-driver circuit of claim 6 wherein the MOSFET comprises a p-channel MOSFET.

8. The H-driver circuit of claim 2 further comprising:
a second pull-up transistor having a first lead and a second lead;
a second current path operatively coupled to the first lead of the second pull-up transistor and having a second RC time constant associated therewith; and
a second mechanism operatively coupled to the first lead of the second pull-up transistor for selectively reducing the second RC time constant of the second current path.

9. The H-driver circuit of claim 8 further comprising:
a first output terminal operatively coupled to the second lead of the first pull-up transistor; and
a second output terminal operatively coupled to the second lead of the second pull-up transistor;
wherein the first mechanism comprises a first feedback mechanism operatively coupled between the second output terminal and the first lead of the first pull-up transistor for selectively reducing the first RC time constant of the first current path and wherein the second mechanism comprises a second feedback mechanism operatively coupled between the first output terminal and the first lead of the second pull-up transistor for selectively reducing the second RC time constant of the second current path.

10. The H-driver circuit of claim 9 further comprising:
a first voltage rail;
a first pull-up resistor operatively coupled between the first voltage rail and the first lead of the first pull-up transistor such that the first pull-up transistor is characterized by a first pull-up resistance;
wherein the first feedback mechanism comprises a first resistance reducer for selectively reducing the first pull-up resistance of the first pull-up transistor so as to selectively reduce the first RC time constant of the first current path; and a second pull-up resistor operatively coupled between the first voltage rail and the first lead of the second pull-up transistor such that the second pull-up transistor is characterized by a second pull-up resistance;
wherein the second feedback mechanism comprises a second resistance reducer for selectively reducing the second pull-up resistance of the second pull-up transistor so as to selectively reduce the second RC time constant of the second current path.

11. The H-driver circuit of claim 10 wherein the first resistance reducer comprises a first transistor and wherein the second resistance reducer comprises a second transistor.

12. An H-driver circuit for driving a write head of a magnetic storage system comprising:
a first and a second voltage supply rail;
a first and a second pull-up means operatively coupled to the first voltage supply rail;
a first pull-up resistor operatively coupled between the first voltage supply rail and the first pull-up means such that the first pull-up means is characterized by a first pull-up resistance;
a second pull-up resistor operatively coupled between the first voltage supply rail and the second pull-up means such that the second pull-up means is characterized by a second pull-up resistance;
a first pull-down means operatively coupled to the first pull-up means and to the second voltage supply rail;
a second pull-down means operatively coupled to the second pull-up means and to the second voltage supply rail;
a first output terminal operatively coupled to the first pull-up means and to the first pull-down means;
a second output terminal operatively coupled to the second pull-up means and to the second pull-down means;
a first feedback means operatively coupled between the second output terminal and the first pull-up means for selectively reducing the first pull-up resistance of the first pull-up means; and
a second feedback means operatively coupled between the first output terminal and the second pull-up means for selectively reducing the second pull-up resistance of the second pull-up means.

13. The H-driver of claim 12 wherein the first and the second feedback means comprise transistors.

14. The H-driver of claim 13 wherein the first and the second feedback means comprise MOSFETs.

15. The H-driver of claim 14 wherein the first and the second feedback means comprise p-channel MOSFETs.

16. A method for selectively reducing one or more RC time constants of an H-driver circuit having a first pull-up transistor characterized by a first pull-up resistance, a first output terminal operatively coupled to the first pull-up transistor, a second pull-up transistor characterized by a second pull-up resistance, and a second output terminal operatively coupled to the second pull-up transistor, the method comprising:
providing a first mechanism operatively coupled to the first pull-up transistor for selectively reducing a first RC time constant of the H-driver circuit; and
selectively reducing the first RC time constant of the H-driver circuit via the first mechanism.

17. The method of claim 16 wherein providing a first mechanism comprises:
providing a first feedback mechanism operatively coupled between the second output terminal and the first pull-up transistor for selectively reducing a first RC time constant of the H-driver circuit.

18. The method of claim 17 wherein providing a first feedback mechanism comprises:

providing a first resistance reducer for selectively reducing the first pull-up resistance of the first pull-up transistor so as to selectively reduce a first RC time constant of the H-driver circuit.

19. The method of claim 18 wherein providing a first resistance reducer comprises providing a transistor.

20. The method of claim 16 further comprising:

providing a second mechanism operatively coupled to the second pull-up transistor for selectively reducing a second RC time constant of the H-driver circuit; and selectively reducing the second RC time constant of the H-driver circuit via the second mechanism.

21. The method of claim 20 wherein providing a first mechanism comprises providing a first feedback mechanism operatively coupled between the second output terminal and the first pull-up transistor for selectively reducing a first RC time constant of the H-driver circuit; and wherein providing a second mechanism comprises providing a second feedback mechanism operatively coupled between the first output terminal and the second pull-up transistor for selectively reducing a second RC time constant of the H-driver circuit.

22. The method of claim 21 wherein providing a first feedback mechanism comprises providing a first resistance reducer for selectively reducing the first pull-up resistance of the first pull-up transistor so as to selectively reduce a first RC time constant of the H-driver circuit; and wherein providing a second feedback mechanism comprises providing a second resistance reducer for selectively reducing the second pull-up resistance of the second pull-up transistor so as to selectively reduce a second RC time constant of the H-driver circuit.

23. The method of claim 22 wherein providing the first resistance reducer comprises providing a first transistor and wherein providing a second resistance reducer comprises providing a second transistor.

* * * * *